US009602072B1

(12) United States Patent
Tsironis

(10) Patent No.: US 9,602,072 B1
(45) Date of Patent: Mar. 21, 2017

(54) COMPACT IMPEDANCE TUNER

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 70 days.

(21) Appl. No.: 14/751,544

(22) Filed: Jun. 26, 2015

Related U.S. Application Data

(60) Provisional application No. 62/017,930, filed on Jun. 27, 2014.

(51) Int. Cl.
  *H03H 7/38* (2006.01)
  *H01P 5/04* (2006.01)
  *H03H 7/40* (2006.01)

(52) U.S. Cl.
  CPC ............ *H03H 7/38* (2013.01); *H01P 5/04* (2013.01); *H03H 7/40* (2013.01)

(58) Field of Classification Search
  CPC .................................. H03H 7/38; H03H 7/40
  USPC ..................... 333/263, 17.3, 32, 33
  See application file for complete search history.

(56) References Cited

U.S. PATENT DOCUMENTS

| 8,212,629 B1* | 7/2012 | Tsironis | H03H 7/185 |
| | | | 333/139 |
| 9,257,963 B1* | 2/2016 | Tsironis | H03H 7/40 |
| 9,276,551 B1* | 3/2016 | Tsironis | H03H 7/38 |

OTHER PUBLICATIONS

Tsironis, U.S. Appl. No. 12/929,643, "Method for Calibration and tuning using impedance tuners".

* cited by examiner

*Primary Examiner* — Stephen E Jones

(57) ABSTRACT

A new slide screw impedance tuner structure uses a circular slabline, eccentrically rotating disc probes and a rotating carriage allowing reducing the linear size of the tuner by a factor of 3. The slabline lies flat on the bench table surface and the disc probe rotates at the end of a rotating arm, which acts as a mobile carriage, forming a planetary configuration. The rotation of the arm controls the phase of GAMMA and the rotation of the disc-probe controls its amplitude.

8 Claims, 12 Drawing Sheets

FIG. 5 (section A-B of Figure 6)

COMPACT IMPEDANCE TUNER

PRIORITY CLAIM

This application claims priority on provisional application 62/017,930 named "COMPACT IMPEDANCE TUNER", filed on Jun. 27, 2014.

CROSS-REFERENCE TO RELATED ARTICLES

1. Load Pull Measurements, http://en.wikipedia.org/wiki/Load_pull
2. "Computer Controlled Microwave Tuner—CCMT", Product Note 41, Focus Microwaves, January 1998.
3. Standing wave ratio, VSWR, https://en.wikipedia.org/wiki/Standing_wave_ratio
4. "High Resolution Tuners Eliminate Load Pull Performance Errors", Application Note 15, Focus Microwaves, January 1995.
5. Anodization, http://en.wikipedia.org/wiki/Anodizing
6. TSIRONIS, U.S. patent application Ser. No. 12/929,643, "Method for Calibration and tuning using impedance tuners"

BACKGROUND OF THE INVENTION

This invention relates to RF load and source pull testing of low noise as well as medium and high power RF transistors and amplifiers using remotely controlled electro-mechanical impedance tuners.

Modern design of low noise or high power RF amplifiers and mixers, used in various communication systems, requires accurate knowledge of the active device's (microwave transistor's) characteristics. In such circuits, it is insufficient for the transistors, which operate either as very low noise or as highly non-linear devices, close to power saturation, to be described using linear or non-linear numeric models.

A popular method for testing and characterizing such microwave components (transistors) in the non-linear region of operation is "load pull" or "source pull". Load/source pull is a measurement technique employing microwave impedance tuners and other microwave test equipment (FIG. 1), such as signal source (1), input and output tuner (2, 4), power meter (5) and test fixture (3) which includes the DUT. The tuners and equipment are controlled by a computer (6) via digital cables (7, 8 and 9). The microwave impedance tuners are devices which allow manipulating the RF impedance presented to the Device Under Test (DUT, or transistor) to test (see ref. 1); this document refers hence to "impedance tuners", in order to make a clear distinction to "tuned receivers (radios)", popularly called elsewhere also "tuners" because of the included tuning circuits (see ref. 2).

Electro-mechanical impedance tuners (FIG. 2) in the microwave frequency range between 100 MHz and 60 GHz are using the slide-screw concept and include a slabline (24) with a test port and an idle port, a center conductor (23) (see also FIG. 3) and one or more mobile carriages (28) which carry a motor (20), a vertical axis (21) which controls the vertical position (216) of a reflective probe (22). The carriages are moved horizontally (217) by additional motors (not shown) and gear (27). The signal enters into one port (25) and exits from the other (26). In load pull the test port is the one where the signal enters, in source pull the test port is the one where the signal exits. The entire mechanism is, typically, integrated in a solid housing (215) since mechanical precision is of highest importance.

The typical configuration of the reflective probe inside the slabline is shown in FIG. 3: a number of parallel reflective tuning elements (31) also called "tuning" probes or slugs, are inserted into the slotted transmission airline (34) and coupled capacitively with the center conductor to an adjustable degree, depending from very weak (when the probe is withdrawn) to very strong (when the probe is very close (within electric discharge—or Corona) to the center conductor; it must be pointed that capacitive "tuning" probes are different from "sampling" probes, which are loosely coupled with the center conductor; when the tuning probes move vertically (36) between a "top position" and a "bottom position" and approach the center conductor (33) of the slabline (34) and moved along the axis (35) of the slabline, they alter the amplitude and phase of the reflection factors seen at the slabline ports, covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50 Ohms (see ref. 3). In a 50 Ohm test system (i.e. when the tuner is terminated at both ports with 50 Ohm), GAMMA is equal to the first element of the slabline s-parameter matrix: GAMMA=S11.

Up to now such metallic tuning probes (slugs) (FIG. 4) have been made in a cubical form (45) with a concave bottom (402) which allows capturing, when approaching the center conductor (401), the electric field which is concentrated in the closest space between the center conductor and the ground planes of the slabline. This field capturing allows creating high and controllable reflection factors. Contact of the probes with the sidewalls (40, 44) is critical. It can be either capacitive (44, FIG. 4b) or galvanic (40, FIG. 4a). If the contact is capacitive, the surface of the probes and/or the sidewalls of the slabline must be electrically insulated. This can be done using chemical process such as anodization (see ref. 5). Capacitive ground contact means extreme requirement in sidewall planarity and straightness to keep the quasi-sliding contact constant for the whole length and depth of the slabline as the probe moves into and along the slabline. Galvanic contact is safer, more repeatable and less vibration sensitive, but requires a spring mechanism to allow for constant pressure of the probe on the sidewalls. The probe of FIG. 4a) must have a springing mechanism (41) which is created by machining a horizontal hole (42) into the body of the probe. Probe 4b) can be massive (45).

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

This invention discloses a new slide screw impedance tuner structure, the compact circular tuner. It comprises the following key components:

A. Circular horizontal slabline with a test port and an idle port,
B. Eccentrically rotating disc-probe,
C. Mobile carriage in form of a rotating radial arm.

Figure 1:
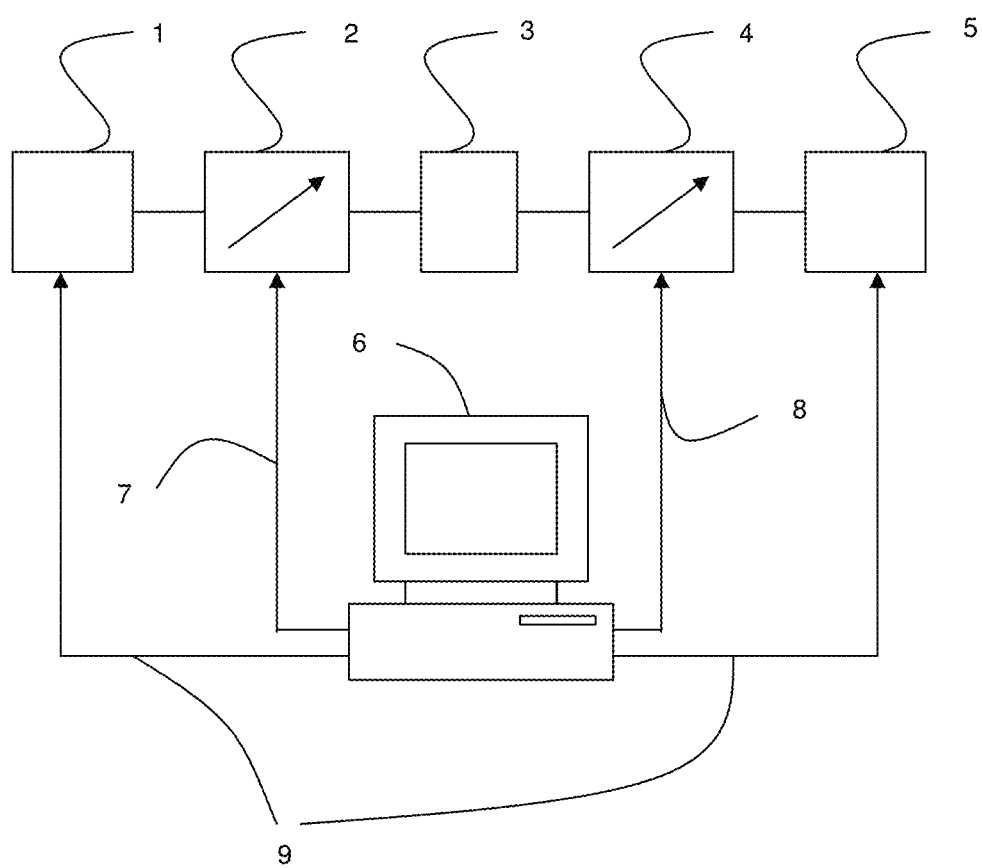
FIG. 1 depicts prior art, a typical automated transistor load pull test system.
Figure 2:
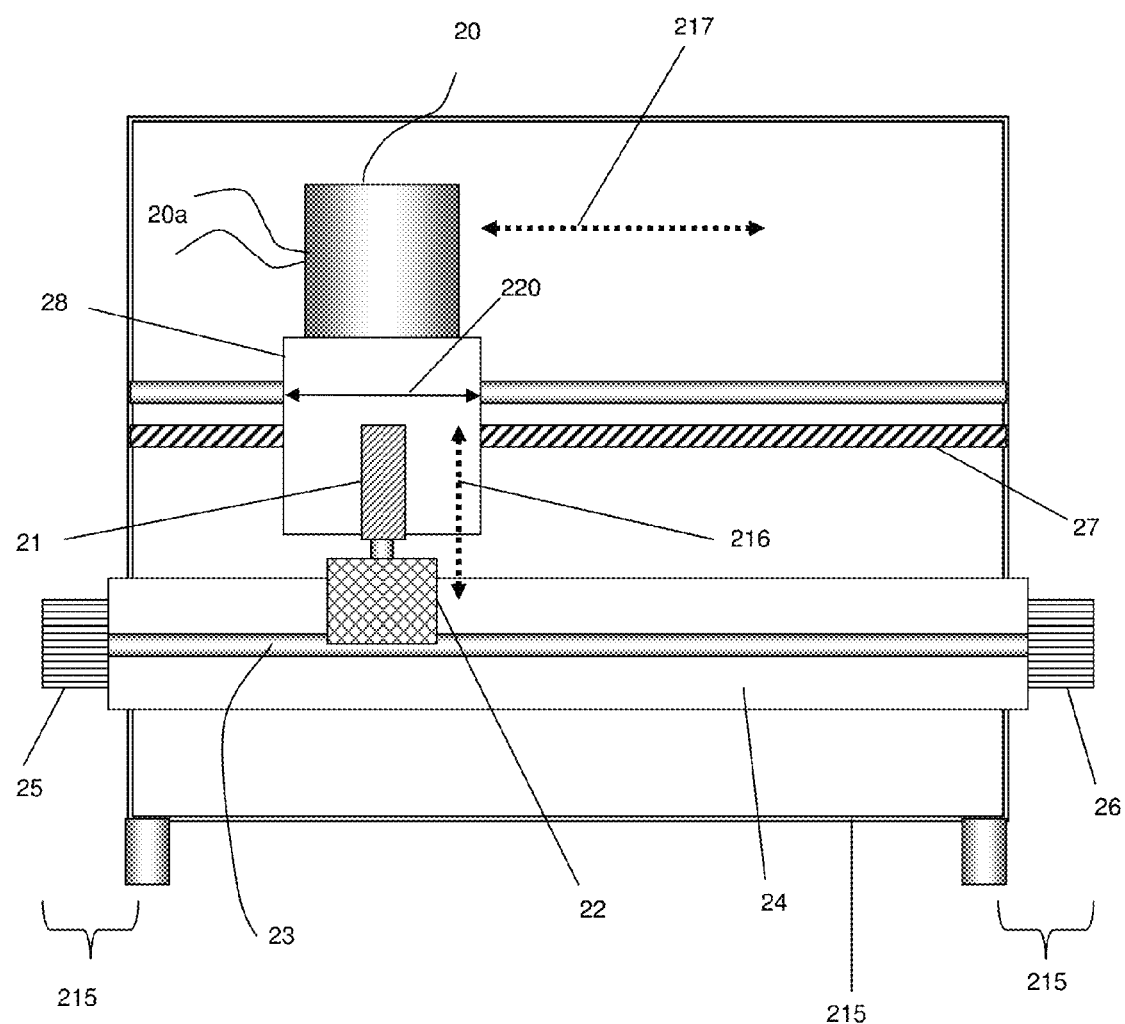
FIG. 2 depicts prior art, a front view of an automated slide screw impedance tuner using a single vertical axis and RF tuning probe (slug).

The effect of using the new structure allows the overall length of a prior art single probe tuner to be reduced by a factor of approximately 3: the compact-circular tuner is approximately ⅓ long as a prior art linear tuner (compare FIGS. 2 and 8 and see ref. 2); table I summarizes this:

TABLE I

Comparison total length of prior art and circular tuner

| Lowest Frequency [MHz] | Prior art Tuner Length [cm] | New Circular Tuner Length [cm] | Length reduction ratio |
|---|---|---|---|
| 100 | 165 | 53 | 3.11 |
| 400 | 46.5 | 15.8 | 2.94 |
| 600 | 33.9 | 11.8 | 2.87 |
| 800 | 27.7 | 9.8 | 2.82 |

The length reduction ratio increases as the frequency decreases, since the carriage width (220) and the width of connectors and sidewalls (215) in a linear tuner (FIG. 2) are a fixed, frequency independent contribution to the overall length; the active section of horizontal travel of the tuner is one half of wavelength ($\lambda/2$) at the lowest operation frequency; this active section increases proportionally with decreasing lowest frequency. In the case of the circular tuner the connectors (604), (606) in FIG. 6, do not add to the overall length (607).

Figure 5:
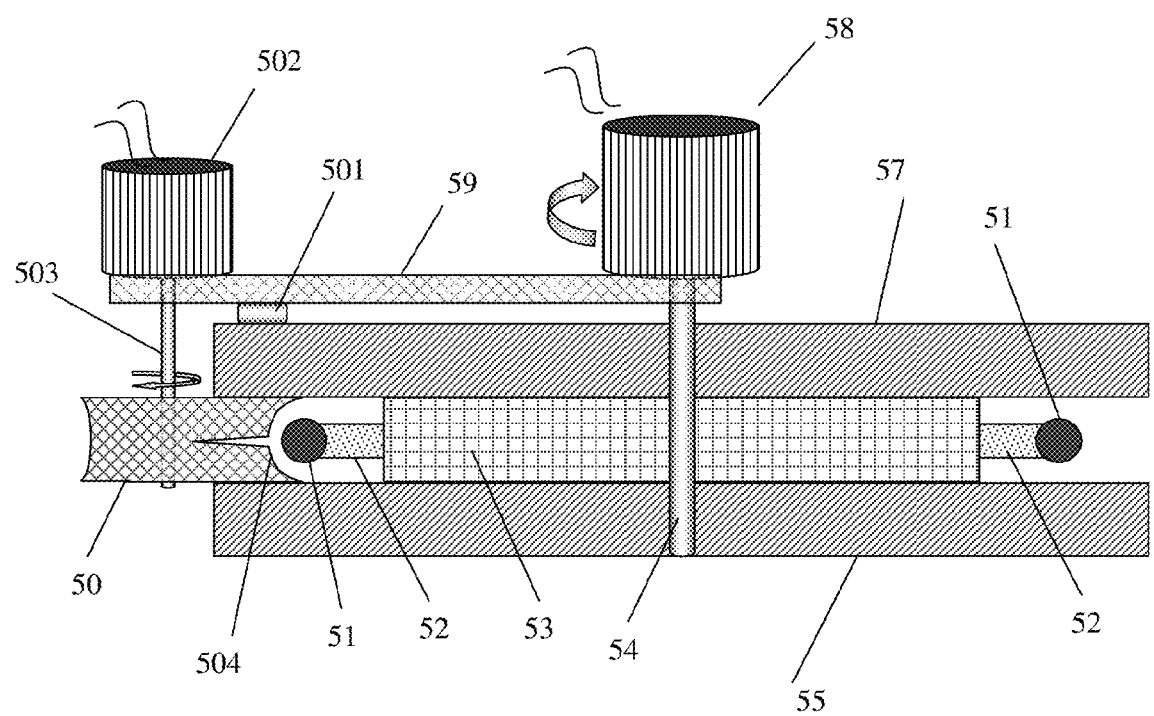
FIG. 5 depicts cross section A-B of circular tuner shown in FIGS. 6, 8 and 9.
Figure 6:
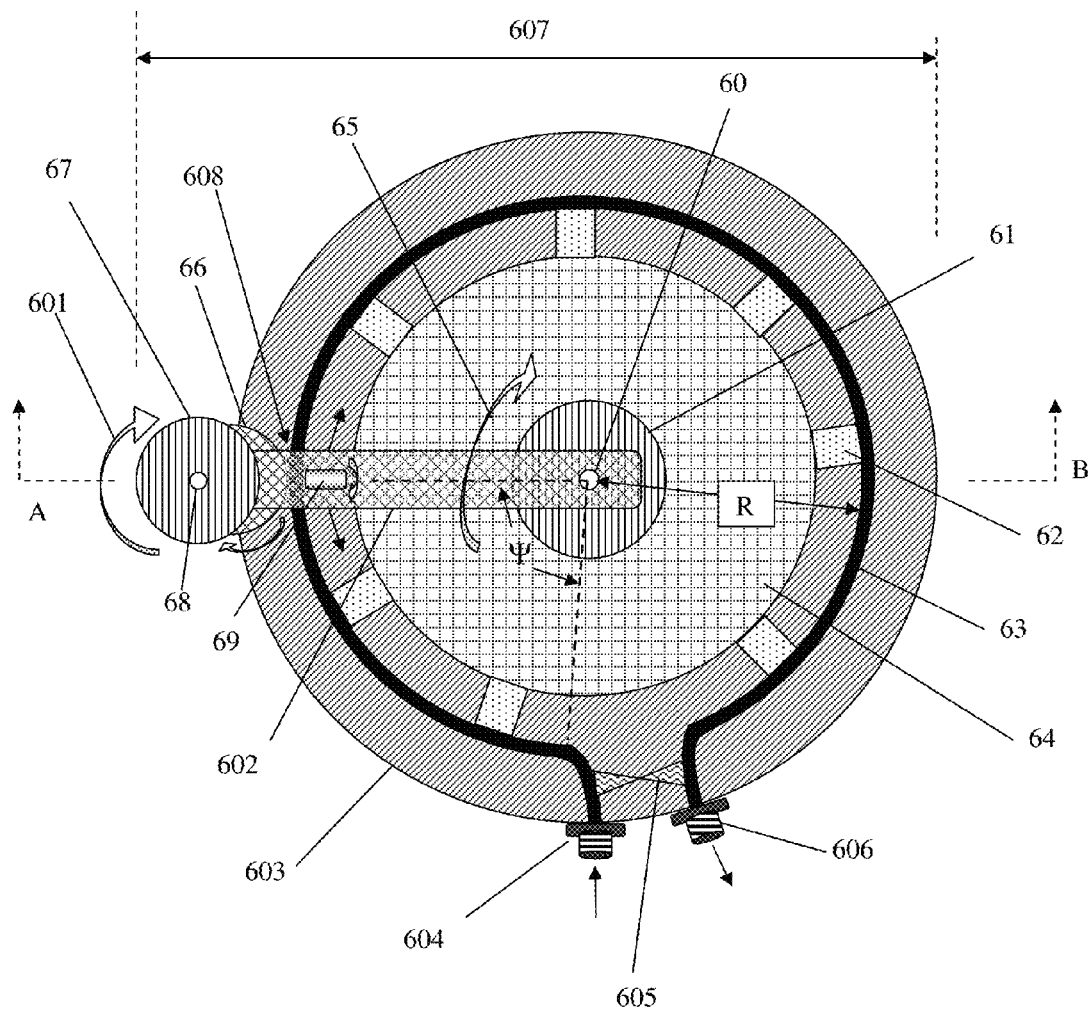
FIG. 6 depicts top view of the circular tuner of FIG. 5, showing the planetary movement of the disc-probe and tuning mechanism (2 rotations: arm rotation around the arm axis and probe rotation around the probe axis).

The circular tuner (FIGS. 5 and 6, FIG. 5 shows a cross section of the top view of FIG. 6) comprises a slabline made of two conductive (preferably metallic) disc plates (55, 57) and held together by a disc formed spacer (53); the center conductor is a toroid (circular rod) (56) which follows the periphery of the spacer (53) and is held in place by a number of supporting dielectric studs (52) distributed on the periphery of the spacer (53). A vertical axis (54) slides in the center of the bottom and top discs (55, 57) and the spacer (53) and is attached on a mobile radial arm (59), which (optionally) carries also the motor control electronic board between both motors (shown in FIG. 10 as item (106)); motor (58) is attached to the mobile arm (59) and rotates with it; at the end of the arm (59) sits a second motor (502) which carries on its axis (503) a metallic disc probe (50). Probe (50) is held eccentrically (see FIG. 7); by rotating the probe (50) its peripheral groove (504) approaches or withdraws from the slabline (55, 57) and the center conductor (51) thus changing the amplitude of the reflection factor GAMMA. The arm (59) is supported by a rolling bearing (501) in order to maintain the vertical position of the probe (50) centered inside the slabline (55, 57).

A top view of the circular tuner is shown in FIG. 6; several elements of the cross section view of FIG. 5 are better visible in this view: the circular disc top and bottom plates (603), the circular center conductor (63), which has a total length of approximately $L=2*\pi*R$, whereby R is the radius of the circular center conductor (63); and the several center conductor supporting studs (62) distributed along the periphery, and the input and output coaxial ports (604) and (606); visible are also both motors (61) and (67), the rotating arm (602) the supporting bearing (69) and part of the tuning disc probe (66) rotating eccentrically around axis (68) forming this way a planetary movement of the probe discs (67) around the center of the slabline discs (60). The rotation (601) of the probe (66) controls the amplitude of GAMMA as it approaches the center conductor at point (608); the rotation (65) of the arm (602) controls the phase $\Psi$ of GAMMA=|GAMMA|*exp(j$\Psi$) as it changes the distance between the input port (604) and the point (608), where the reflection is created.

Figure 7:
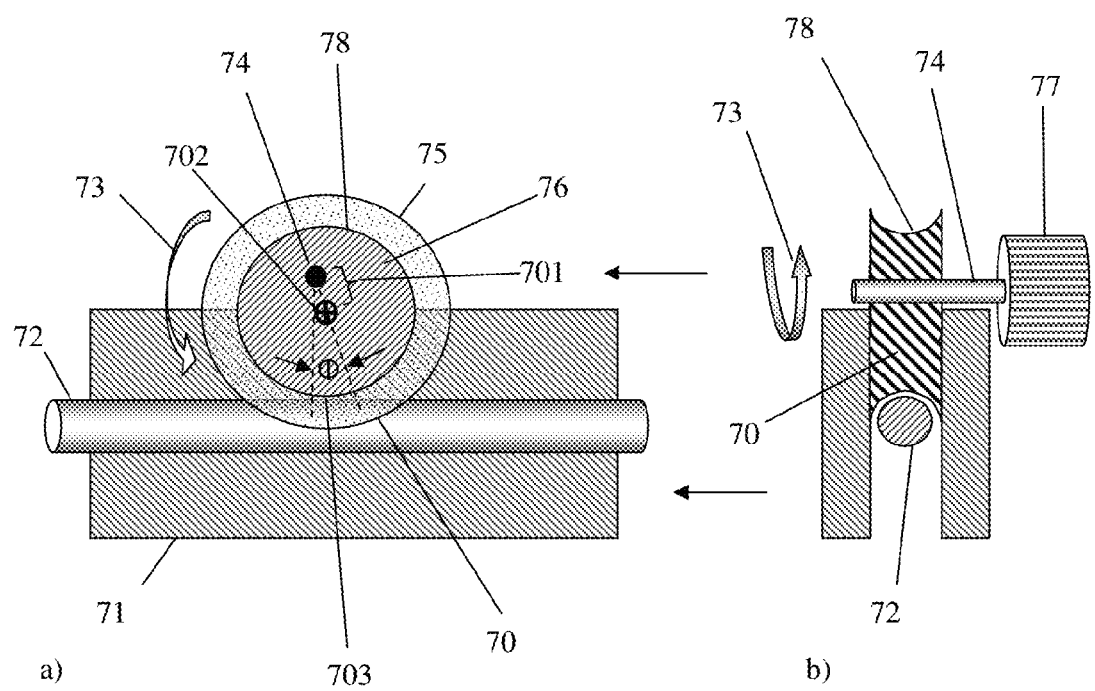
FIG. 7 depicts top (a) and cross section (b) view of the disc-probe and its operation inside the circular slabline.

The control mechanism for the amplitude of GAMMA is shown in detail in FIG. 7: the rotation axis (74) of the disc probe (75) is placed eccentrically; the probe rotates around axis (74) whereby the geometrical center is at point (702); by rotating (73) the probe, using the motor (77) we control the coupling (distance between the bottom of the channel (78) and the center conductor) (72); this changes the amplitude of GAMMA between a minimum value close to 0 and a maximum value close to 1. By shaping the form and depth of the channel (78) and adjusting the eccentricity (701) between the rotation axis (74) and the geometric center of the disc-probe (702), we can adjust the minimum and maximum coupling between the probe (70) and the center conductor (72) seamlessly and thus we can control the amplitude of GAMMA. By varying the eccentricity distance (701) we can create extremely high tuning resolution; on the other hand, in order to create acceptable minimum (residual) coupling and GAMMA (corresponding to tuner initialization) the eccentricity (701) must have a minimum value. It has been found experimentally and through simulations, that typical eccentricity (701) must be at least of the order of 2 times the diameter of the center conductor (72). The rotation axis (74) is attached to an electric stepper motor (77), which controls the rotation angle ($\theta$) and the distance (703) between the bottom (78) of the disc-probe (70) and center conductor (72). The tuning resolution TR at the closest point (703) between probe bottom (78) and center conductor (72) is inversely proportional to the change in |GAMMA| as a function of the change in angle $\Phi$: $TR=1/\{\partial|GAMMA|/\partial\Phi\}=1/\{(R+r)*sin(\Phi)\}\approx1/\{(R+r)*\Phi\}$; whereby $\Phi$ is the angle of rotation of the geometrical center (702) of the probe around the rotation axis (74); for $\Phi\approx0$ the Tuning Resolution TR becomes close to infinite: $TR=\partial\Phi/\partial|GAMMA|\approx\infty$.

Figure 3:
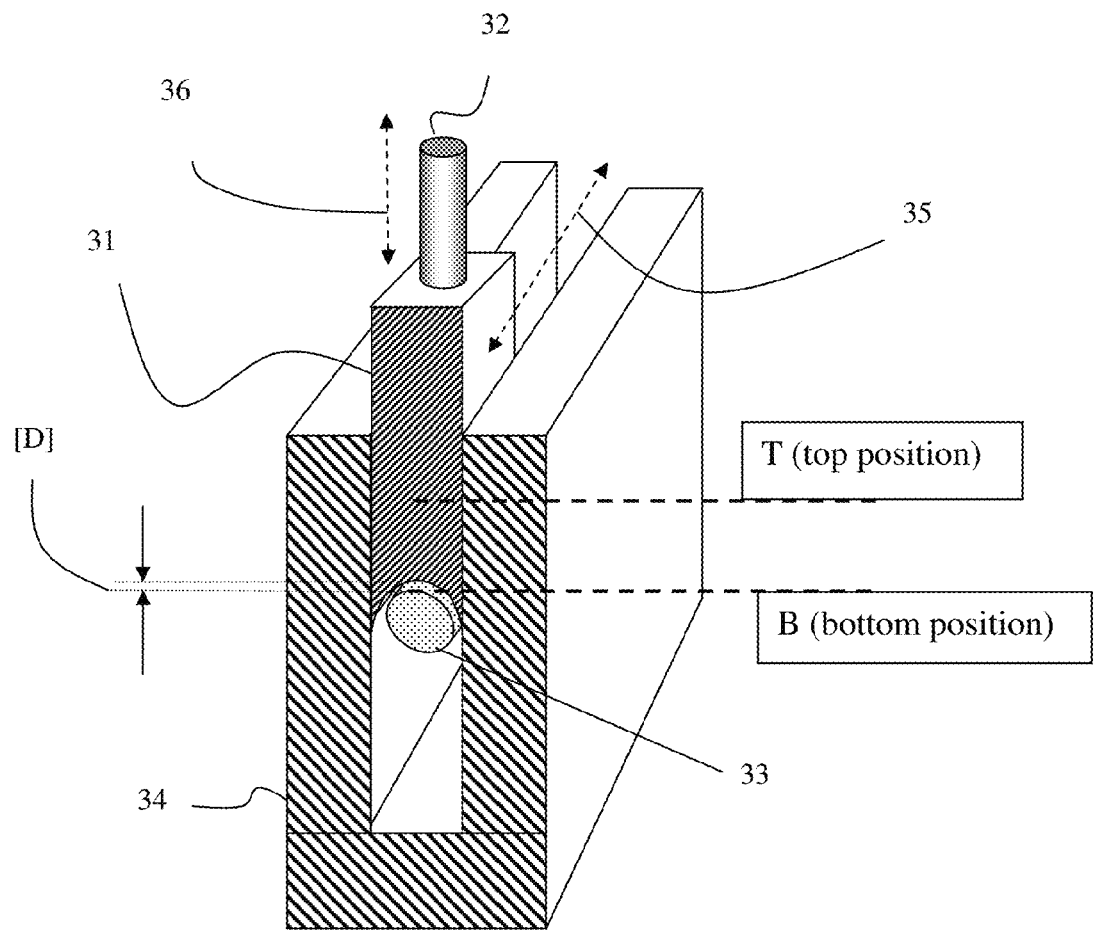
FIG. 3 depicts prior art, RF probe (slug) inside a slotted airline (slabline) approaching the center conductor in a perspective view and the relevant dimensions and parameters of the operation.
Figure 4:
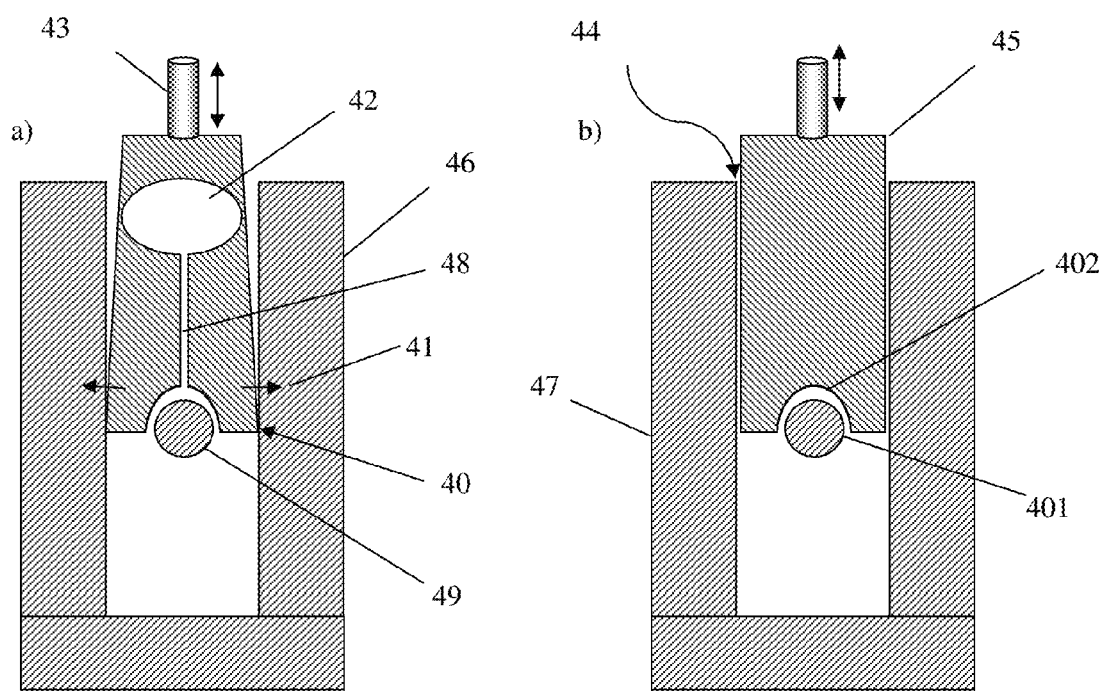
FIG. 4 depicts prior art, cross section of typical probe configurations: a) with galvanic ground contact to the slabline walls and spring mechanism; b) with capacitive RF ground contact.
Figure 11:
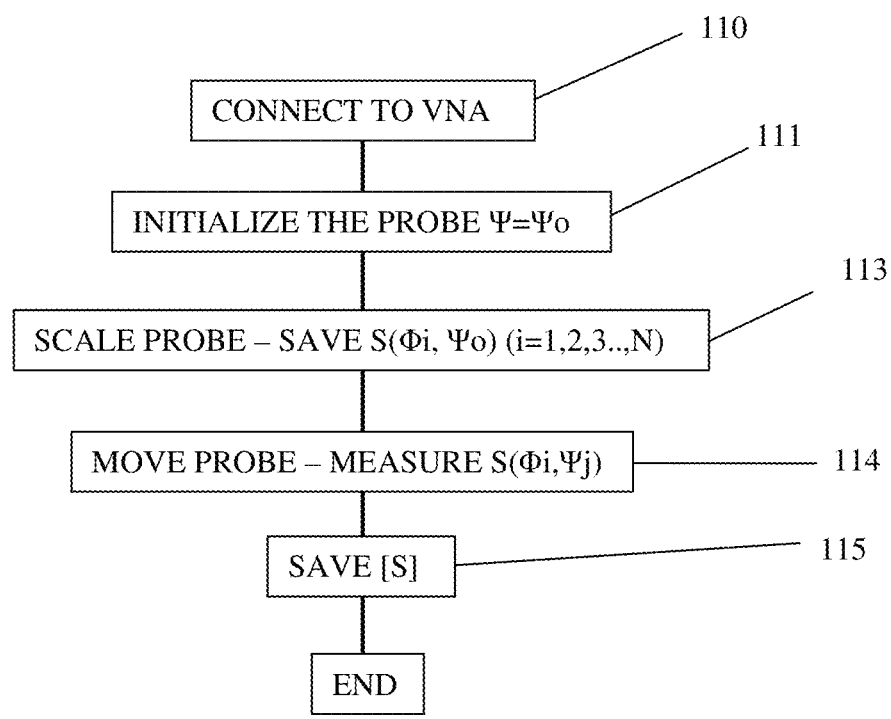
FIG. 11 depicts a calibration flowchart of circular impedance tuner.
Figure 12:
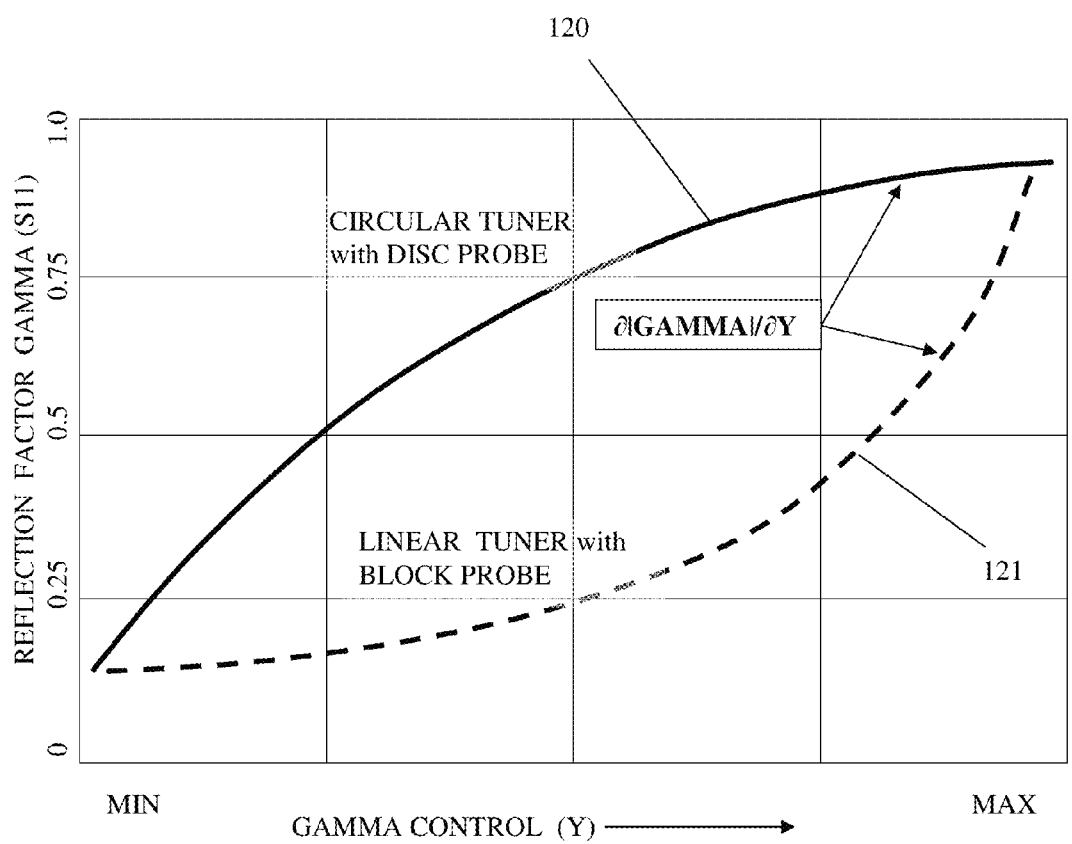
FIG. 12 depicts the comparative reflection behavior of disc probes versus prior art block probes as a function of probe penetration in the slabline.

Typical reflection factor behavior of the basic types of tuning probes as a function of CONTROL is shown in FIG. 12. Trace (120) corresponds to the rotating disc-probes used in the present circular tuner, whereas trace (121) corresponds to prior art cubical probes (slugs) which are used in linear, hitherto tuners (FIGS. 3 and 4). In FIG. 11 the horizontal axis (GAMMA CONTROL) signifies the amount of coupling between the probe and the center conductor and is denominated generally as "Y"; for cubical probes in FIGS. 3 and 4 this signifies the distance [D] between the probe and the center conductor of the slabline, whereas in circular tuners with disc probes (FIG. 7) this signifies the angle of the probe rotation, presuming that at a certain angle (which we can deliberately define as $\Phi=0$) the disc-probe will be as coupled with the center conductor as the cubical probe (slug) of FIGS. 2 and 3, and will create the same level of reflection. The superior resolution, corresponding to the progressing flatness of trace (120) of the disc-probe at high GAMMA, is immediately obvious from FIG. 12. The change of GAMMA as a function of CONTROL is inverse proportional to the tuning resolution TR: TR=1/($\partial$|GAMMA|/$\partial$Y) at high GAMMA is much higher for disc probes than for cubical probes. Tuning resolution is important for tuner accuracy, since, at high tuning resolution (which in our case corresponds to most useful range of maximum GAMMA) the effect of mechanical repeatability errors and loss of motor steps on tuning accuracy is strongly reduced. This means that small mechanical errors in probe angle positioning would cause negligible tuning errors. This is opposite, and much better, than in prior art tuners, where tuning resolution decreases at high GAMMA (see ref. 4).

Figure 8:
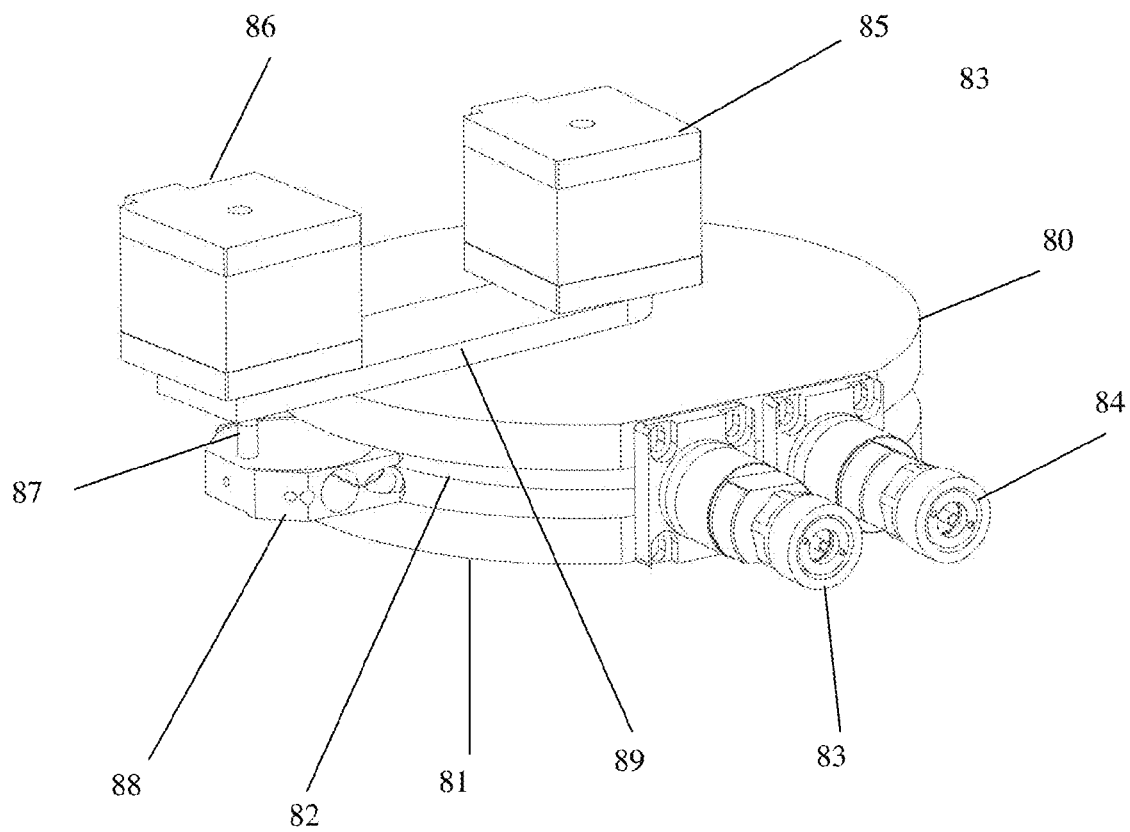
FIG. 8 depicts a perspective view of the circular tuner.
Figure 9:
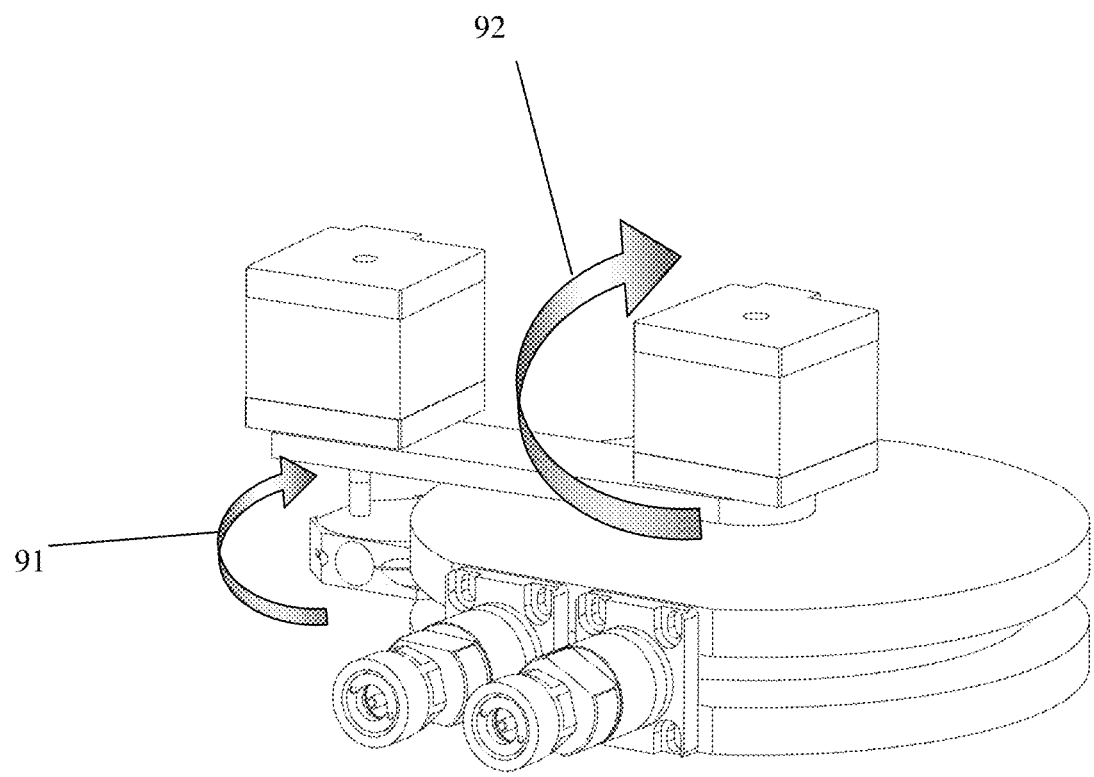
FIG. 9 depicts a perspective view of the circular tuner and the rotational movements of the carriage and the probe.

A perspective view of the circular tuner is shown in FIGS. 8 and 9: In FIG. 8 most parts disclosed before are visible: Motors for phase control (85) and amplitude control (86) of GAMMA; top (80) and bottom (81) plate of the slabline; center conductor (82); probe axis (87) and disc-probe (88), the probe comprises a center hole for practical reasons, in order to establish reliable sliding contact with the slabline walls; rotating arm (89) and input (83) and output (84) coaxial ports. In FIG. 9 the rotation of the probe (91) and of the arm (92) are also shown.

Figure 10:
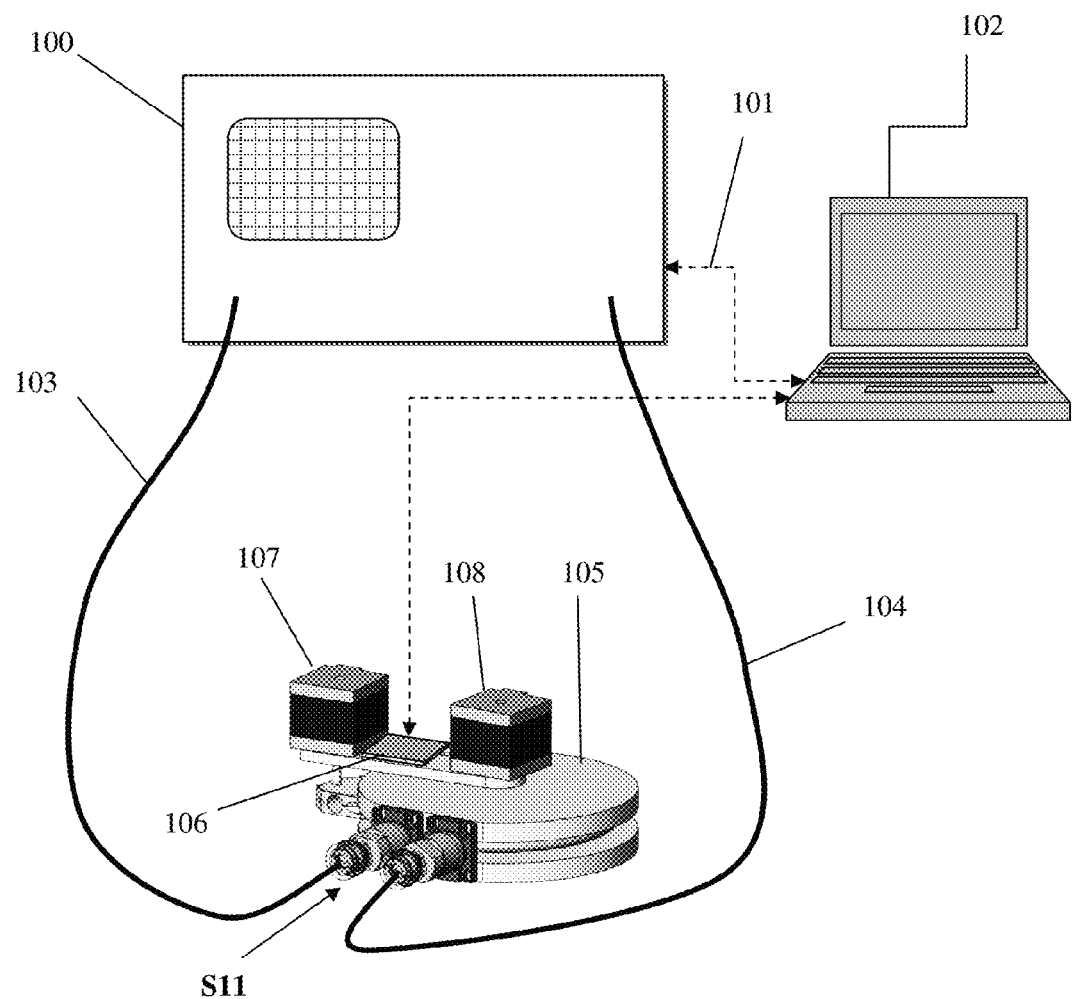
FIG. 10 depicts a setup to calibrate a compact circular tuner.

The tuner calibration process uses a setup as shown in FIG. 10: the tuner is connected to a pre-calibrated vector network analyzer (VNA), (100) using high quality RF cables (103, 104); the stepper motors (107, 108) are directed by the control board (106), which communicates with the computer (102) in order to rotate the disc probes into the slot of the slabline in order to increase the GAMMA value, and the arm around the center of the slabline in order to adjust the phase, all while reading the four scattering parameters (s-parameters) from the VNA (100), using standard communication cable (101) and protocol.

After connecting the tuner to the pre-calibrated VNA (110) and initializing (111), in a first (scaling) step (113, FIG. 11), the reflection factor of the tuner at the test port is measured (for a source tuner test port is the signal exiting port, for a load tuner test port is the signal entry port) at typically 5 to 30 angle $\Phi$ values of the disc-probe, corresponding to minimum and maximum GAMMA (or S11), and saved in a scaling file in the form S11($\Phi$i, $\Psi$o) (113); whereby $\Phi$i is the relative angle of the probe rotation, starting with an initial position (zero), relative to the vertical direction (FIG. 7) and $\Psi$o is the arm rotation initialization angle (corresponding to "horizontal" zero; subsequently two-port s-parameters are measured (114) for combinations of both angles and saved in the form Sij($\Phi$i, $\Psi$j); the horizontal position in linear tuner (FIG. 2) corresponds to the angle $\Psi$j between the axis of the rotating arm (602) between a starting direction reference angle $\Psi$o (set arbitrarily to zero), and a maximum angle $\Psi$max; the angle {$\Psi$max−$\Psi$o} corresponds to a linear travel of the probe of one half of a wavelength at the periphery at the selected frequency: $\Psi$max−$\Psi$o=$\lambda$/(2*$\pi$*R), whereby R is the radius of the circular (toroid) center conductor and $\lambda$, the wavelength at the test frequency. The measured data are then saved in a matrix [S] (115). This procedure is repeated for each frequency of interest and the data are saved for later use.

Impedance synthesis using s-parameters of pre-calibrated tuners is a specific procedure related to specific tuners, which, in general terms, has been disclosed before (see ref. 6); this does not, however, limit the scope of the invention itself, since the invention relates to the new circular layout of the slabline and disc-probes used in the tuner apparatus rather than the tuning technique and presumes appropriate control software allowing calibration and tuning to be available. The calibration procedure has been laid out briefly only in order to manifest the fact that this wideband tuner is being used for impedance synthesis, when calibrated and the calibration data used accordingly.

When an impedance synthesis (tuning) is requested by a user, the computer loads the calibration data from memory (RAM or hard-disk) into its active memory and scans through the S11 data points to find the closest match between a calibrated reflection factor point and the requested GAMMA (or impedance). After this first step a second search is performed, in which interpolated data between calibration points are used (see ref. 4) and a final match is found, usually very close or identical to the requested value, within approximately 1% or better in reflection factor terms. The tuning error TE is defined as TE=|GAMMA.target−GAMMA.tuned|$^2$, whereby vector GAMMA=|GAMMA|*exp(j<GAMMA>), whereby <GAMMA> is the angle of the reflection factor.

The interpolated s-parameters Sij of the tuner are calculated for an arbitrary state ($\Phi$, $\Psi$) using a set of the 9 closest calibrated states and the following interpolation formulas:

$$Sij(\Phi,\Psi k)=A(\Phi)*Sij(\Psi k,\Phi 1)+B(\Phi)*Sij(\Psi k,\Phi 2)+C(\Phi)*Sij(\Psi k,\Phi 3), \quad (1)$$

$$Sij(\Phi,\Psi)=A(\Psi)*Sij(\Psi 1,\Phi)+B(\Psi)*Sij(\Psi 2,\Phi)+C(\Psi)*Sij(\Psi 3,\Phi), \quad (2)$$

whereby {i,j}={1, 2} and k={1, 2, 3}. The coefficients A, B, C are calculated using the following relations:

$$A(\Theta)=(\Theta-\Theta 2)*(\Theta-\Theta 3)/((\Theta 1-\Theta 2)*(\Theta 1-\Theta 3)); \quad (3)$$

$$B(\Theta)=(\Theta-\Theta 1)*(\Theta-\Theta 3)/((\Theta 2-\Theta 1)*(\Theta 2-\Theta 3)); \quad (4)$$

$$C(\Theta)=(\Theta-\Theta 2)*(\Theta-\Theta 1)/((\Theta 3-\Theta 2)*(\Theta 3-\Theta 1)); \quad (5)$$

whereby $\Theta$ is a generic variable that can be replaced, in equations (3) to (5), by $\Phi$ or $\Psi$ accordingly; $\Psi$ corresponds to the physical rotation angle of the mobile arm, and thus to the linear distance between the test port and the probe or the equivalent horizontal position of the probe in a prior art linear tuner, and $\Phi$ corresponds to the rotation of the disc probe and thus to the distance between the bottom of the probe groove and the center conductor inside the slabline, or the vertical position of prior art probes. These formulas allow calculating the s-parameters of the tuner using 3 sets of calibrated points ($\Psi$i,$\Phi$j) with {i,j}={1, 2, 3}, surrounding the requested generic target position {$\Psi$,$\Phi$} on the Smith chart. These 3 sets of points are: point 1: ($\Psi$1,$\Phi$1), ($\Psi$1,$\Phi$2), ($\Psi$1,$\Phi$3); point 2: ($\Psi$2,$\Phi$1), ($\Psi$2,$\Phi$2), ($\Psi$2,$\Phi$3); and point 3: ($\Psi$3,$\Phi$1), ($\Psi$3,$\Phi$2), ($\Psi$3,$\Phi$3). The $\Psi$i and $\Phi$j values are the angular coordinates of the closest calibrated points to the target reflection factor. The choice is adequate because a rotation of the arm (T) changes the distance of the probe and the carriage from the test port and thus the phase of the reflection factor and a rotation (Φ) of the disc-probe changes the gap between the probe and the center conductor and thus the amplitude of the reflection factor.

In particular the tuning procedure follows the following steps:
  i. The user defines the target impedance (GAMMA.target);
  ii. The search algorithm operates in computer memory and searches through the calibration data for the calibrated reflection factor value S11.c closest to GAMMA-target, for which the vector difference |S11.c-GAMMA.target| is smallest;
  iii. The probe rotation angle Φ, and arm rotation angle Ψ are changed alternatively using interpolated points, all in computer memory, in the vicinity of the calibrated point S11.c for S11 values closer than S11.c to GAMMA.target;
  iv. The arm angle Ψt and the probe angle Φt of the disc-probe corresponding to the closest found calibrated or interpolated point to GAMMA.target are determined;
  v. The mobile arm is rotated to the angle Ψt and the probe to the angle Φt, found in step (iv) to create the requested GAMMA.target.

This invention has been described in a basic preferred embodiment; obvious alternatives and configurations, to the disclosed concept of circular compact slide screw tuners using rotating carriages and disc probes, are possible but shall not impede on to the validity of the present invention.

What I claim as my invention is:

1. A circular slide screw impedance tuner, comprising
   a test port and an idle port and a circular slabline between said ports,
   and a mobile carriage carrying a reflective (tuning) probe, said probe sliding in out and along the slot of the slabline;
   whereby the slabline comprises two parallel conductive disc plates, a top and a bottom disc;
   said discs having a common center and the same diameter;
   and a center conductor having toroid form and the same center as the discs, and being mounted floating centered flat between the two discs;
   whereby the discs and the center conductor are mounted at certain space to each-other forming a circular transmission airline with characteristic impedance Zo;
   whereby the mobile carriage is a radial arm which is attached to the axis of a first stepper motor, slides on top of the top disc and rotates around the center of the discs,
   whereby the first stepper motor is mounted at the center of the discs;
   and whereby a second stepper motor is mounted at the peripheral end of the radial arm;
   and whereby the reflective tuning probe is disc shaped and is
     a) mounted eccentrically,
     b) rotating around the axis of the second motor,
     c) sliding in and out and along the slot of the slabline,
   moving hereby on a planetary trajectory around the axis of the first motor.

2. Reflective tuning disc-probes for circular tuners as in claim 1, have a
   thickness matching the width of the slot of the slabline;
   and a concave channel (groove) on the disc periphery parallel to the disc surface,
   whereby the groove diameter matches the diameter of the cross section of the center conductor of the slabline;
   and wherein the rotation axis of the disc-probe is placed eccentrically relative to the geometrical center and is perpendicular to the center conductor of the slabline,
   whereby the probe follows planetary trajectory movement around its own axis and the center of the slabline discs.

3. A circular slabline for tuner as in claim 1, having a top and bottom metallic disc plate, and a spacer disc sandwiched between the top and bottom discs,
   and a center conductor having a cylindrical cross section and toroid form and being secured floating at equal distance between the plates,
   whereby the radius of the center conductor toroid is smaller than the radius of the top and bottom plates by at least three times the diameter of the center conductor cross section,
   and whereby the radius of the spacer disc is smaller than the radius of the center conductor toroid by at least four times the diameter of the cross section of the center conductor,
   and whereby the thickness of the spacer disc and the diameter of the center conductor are selected for creating characteristic impedance Zo of the slabline.

4. A slabline as in claim 3 whereby the characteristic impedance Zo is 50 Ohms.

5. Input and output coaxial ports for the slabline of claim 3, use coaxial connectors;
   whereby the connectors have a center conductor and a grounded external cylindrical mantle,
   and whereby the center conductor of the connectors is a continuation of the toroid center conductor of the slabline and is bent by approximately 90 degrees from the toroid path towards the periphery of the slabline disc plates,
   and whereby the coaxial connectors are mounted flat against the vertical walls of the disc plates.

6. A calibration method for circular electro-mechanical impedance tuner as in claim 1, connected to a pre-calibrated vector network analyzer (VNA), comprises the following steps:
   a) initialization step, whereby the tuner is initialized, i.e. the mobile arm is rotated to an initial angle Ψo and the disc-probe is rotated to an initial angle Φo creating minimum reflection;
   b) scaling step, whereby the disc-probe is rotated into the slot of the slabline, the reflection factors S11.i are measured at the tuner test port for a number N of rotation angles Φ.i between minimum reflection (Φ.min) and maximum reflection (Φ.max), and saved in memory, whereby $0 < i \leq N$;
   c) calibration step, whereby tuner s-parameters S11.ij, S12.ij, S21.ij, S22.ij are measured by the VNA for a multitude of combinations {i, j} of the rotation angles Φ.i, determined at step b), and rotation angles Ψ.j of the mobile arm, between Ψ.min=Ψo and at least Ψ.max=λ/(2*π*R), whereby R is the radius the circular center conductor, and λ is the wavelength at the selected frequency;
   d) saving step, whereby s-parameters are saved in a calibration file in a matrix format [S(Φ.i, Ψ.j)] for later use.

7. A calibration method as in claim 6, whereby N is an integer number between 5 and 30.

8. An impedance synthesis algorithm for tuners, calibrated as in claim 6, comprise the following steps:
   a) user definition of the target impedance (GAMMA.target);
   b) search algorithm, in computer memory, through the calibration data for identifying the calibrated reflection factor value (S11.c), for which the vector difference to GAMMA.target is minimum;
   c) alternative probe angle ($\Phi$) and arm angle ($\Psi$) search, in computer memory, among interpolated points in the vicinity of the calibrated point S11.c for S11 the value closest to GAMMA.target;
   d) save the arm angle ($\Psi t$) and the probe angle ($\Phi t$) corresponding to the closest found calibrated or interpolated point to GAMMA.target, found in step (c);
   e) rotate the mobile arm to the angle $\Psi t$ and the probe to the angle $\Phi t$, of step (d).

* * * * *